United States Patent [19]

Wukusick et al.

[11] Patent Number: 5,154,884
[45] Date of Patent: Oct. 13, 1992

[54] SINGLE CRYSTAL NICKEL-BASE SUPERALLOY ARTICLE AND METHOD FOR MAKING

[75] Inventors: Carl S. Wukusick, Cincinnati; Leo Buchakjian, Jr., Fairfield, both of Ohio

[73] Assignee: General Electric Company, Cincinnati, Ohio

[21] Appl. No.: 760,860

[22] Filed: Sep. 18, 1991

Related U.S. Application Data

[63] Continuation of Ser. No. 593,595, Oct. 1, 1990, abandoned, which is a continuation of Ser. No. 418,760, Oct. 6, 1989, abandoned, which is a continuation of Ser. No. 143,201, Jan. 11, 1988, abandoned, which is a continuation of Ser. No. 931,957, Nov. 24, 1986, abandoned, which is a continuation of Ser. No. 619,676, Jun. 11, 1984, abandoned, which is a continuation of Ser. No. 307,819, Oct. 2, 1981, abandoned.

[51] Int. Cl.$^5$ .................. C22C 19/05; C22F 1/10
[52] U.S. Cl. .................. 420/448; 148/404; 148/410; 148/428; 148/555; 148/562
[58] Field of Search ............ 420/442, 448; 148/410, 148/428, 404, 3, 162

[56] References Cited

U.S. PATENT DOCUMENTS

| | | | |
|---|---|---|---|
| 3,260,505 | 7/1966 | Ver Snyder | 253/77 |
| 3,494,709 | 2/1977 | Piearcey | 416/232 |
| 3,619,182 | 11/1971 | Bieber et al. | 426/448 |
| 4,116,723 | 9/1978 | Gell et al. | 148/3 |
| 4,152,488 | 5/1979 | Schilke et al. | 428/678 |
| 4,209,348 | 6/1980 | Duhl et al. | 148/3 |
| 4,222,794 | 9/1980 | Schweizer et al. | 148/3 |
| 4,261,742 | 4/1981 | Coupland et al. | 75/134 |
| 4,371,404 | 2/1983 | Duhl et al. | 148/3 |
| 4,402,772 | 9/1983 | Duhl et al. | 148/404 |
| 4,459,160 | 7/1984 | Meetham | 148/3 |
| 4,582,548 | 4/1986 | Harris et al. | 148/404 |
| 4,639,280 | 1/1987 | Fredholm et al. | 148/404 |
| 4,643,782 | 2/1987 | Harris et al. | 148/404 |
| 4,719,080 | 1/1988 | Duhl et al. | 420/443 |

FOREIGN PATENT DOCUMENTS

| | | |
|---|---|---|
| 0155827 | 9/1985 | European Pat. Off. |
| 0208645 | 1/1987 | European Pat. Off. |
| 0225837 | 6/1987 | European Pat. Off. |
| 2749080 | 5/1978 | Fed. Rep. of Germany |
| 2817321 | 11/1978 | Fed. Rep. of Germany |
| 2821524 | 12/1978 | Fed. Rep. of Germany |
| 2949158 | 6/1980 | Fed. Rep. of Germany |
| 3234090 | 4/1983 | Fed. Rep. of Germany |
| 3248134 | 7/1983 | Fed. Rep. of Germany |
| 1592237 | 7/1981 | United Kingdom |
| 2105748 | 3/1983 | United Kingdom |
| 2121312 | 7/1985 | United Kingdom |
| 2112812 | 10/1985 | United Kingdom |
| 2110240 | 3/1986 | United Kingdom |

OTHER PUBLICATIONS

DE2821524, Dec. 1978.
DE3023576, Jul. 1987.
DE3234083, Apr. 1983.
GE-Final Report-"Directional Solidification Alloy Development"-No. NADC-78136-60, made under Contract No. N62269-78-C-0315 to Dept. of Navy (1 Sep. 1978-1 Jan. 1980).

*Primary Examiner*—R. Dean
*Assistant Examiner*—Margery S. Phipps
*Attorney, Agent, or Firm*—Stephen S. Strunk; Jerome C. Squillaro

[57] ABSTRACT

A nickel-base superalloy, particularly adapted for use in gas turbine engine single crystal blades and vanes is provided with a specific composition and heat treated in a particular manner to exhibit an improved balance of critical high temperature mechanical properties and resistance to oxidation and hot corrosion significantly superior to presently available alloys. In its broad form, the alloy composition comprises, by weight, 7-12% Cr, 1-5% Mo, 3-5% Ti, 3-5% Al, 5-15% Co, 3-12% W, up to 10% Re, 2-6% Ta, up to 2% Cb, up to 3% V, up to 2% Hf, the balance being essentially nickel and incidental impurities. Nickel-base superalloy single crystal articles formed of the alloy are described, as is the method, including heat treatment, employed to make the article.

16 Claims, 1 Drawing Sheet

SINGLE CRYSTAL NICKEL-BASE SUPERALLOY ARTICLE AND METHOD FOR MAKING

The Government has rights in this invention pursuant to Contract No. N62269-78-C-0315 awarded by the Department of the Navy.

This application is a continuation of application Ser. No. 07/593,595, filed Oct. 1, 1990, now abandoned, which is a continuation of application Ser. No. 07/418,760, filed Oct. 6, 1989, now abandoned, which is a continuation of application Ser. No. 143,201, filed Jan. 11, 1988, now abandoned, which is a continuation of application Ser. No. 931,957, filed Nov. 24, 1986, now abandoned, which is a continuation of application Ser. No. 619,676, filed on Jun. 11, 1984, now abandoned, which is a continuation of application Ser. No. 307,819 filed Oct. 2, 1981, now abandoned.

BACKGROUND OF THE INVENTION

1. Field of the Invention

The present invention relates to a nickel-base superalloy, article made thereof and method for making such article. More particularly, the invention relates to such an article having a single crystal structure with an improved combination of mechanical properties and resistance to oxidation and hot corrosion.

2. Description of the Prior Art

The efficiency of gas turbine engines depends significantly on the operating temperature of the various engine components. Increased operating temperatures will result in higher efficiency engines. This requirement has led to the development of heat-resistant nickel-base superalloys which will withstand high temperatures and maintain their basic material properties at high temperatures. The requirement for increased operating temperatures has also led to the development of highly complex cast hollow shapes which will provide efficient cooling of the material used to produce such shapes.

The casting processes used with earlier nickel-base superalloys generally produced parts which contained equiaxed grains (nonoriented structures) of the type normally found in most cast metal articles. These earlier nickel-base superalloys are generally referred to as conventional nickel-base superalloys. Improvements in alloy performance, i.e., the ability to withstand higher temperature without impairing other needed qualities, were achieved through alloy development and the introduction of improved processing techniques. The strength of such alloys, and other important characteristics, were dependent upon the strengths of the grain boundaries developed during the casting process. The application of conventionally cast equiaxed articles was limited because the grain boundaries of the nickel-base alloys produced by the earlier casting methods could not be strengthened to the same level as the internal structure of the grains and eventually became weak links in the structure, limiting the potential strength and life of the alloy and article produced therefrom. To enhance such alloys, initial efforts were aimed at strengthening the grain boundaries by the addition of various grain boundary strengthening elements such as carbon (C), boron (B), zirconium (Zr), and hafnium (Hf).

Efforts to further develop strength levels in nickel-base superalloys by reducing or eliminating grain boundaries were initiated. Preferentially orienting the grains in the direction of the principal stress axis, which generally coincides with the longitudinal direction, to provide a columnar grain structure (grains oriented in a single direction, each having long, slender proportions) eliminates grain boundaries transverse to the growth direction. Such a structure provides increased strength and ductility along the principal stress axis. Such an oriented grain structure was found to be achievable by a process referred to as directional solidification which had long been used for other purposes, such as the development of magnets. That process has been described and improved upon, for instance, in U.S. Pat. No. 3,897,815-Smashey, issued Aug. 5, 1975, the disclosure of which is incorporated herein by reference.

When compared with conventionally cast alloy articles, the application of the directional solidification process has produced cast articles exhibiting increased strength in the longitudinal direction due to the elimination of grain boundaries. In addition, it has provided an increase in other properties, such as improved ductility and resistance to low cycle fatigue, due to such preferred grain orientation. However, reduced strength and ductility properties has still existed in the transverse directions due to the presence of columnar grain boundaries in such directionally solidified columnar structure articles. Additions of Hf, C, B, and Zr were utilized to improve the transverse grain boundary strength of such alloys as was done previously in conventional equiaxed nickel-base superalloys. However, these elemental additions also acted as melting point depressants. This resulted in limitations in alloying and in heat treatment which would not allow the development of maximum strengths within such directionally solidified alloys. The addition of Hf, C, B, and Zr was further found to compromise additional properties.

In U.S. Pat. No. 4,169,742-Wukusick, et al., issued Oct. 2, 1979, vanadium was found to be necessary in order to attain in the alloy article high stress rupture strengths with adequate castability (freedom from grain boundary cracking). However, vanadium can be detrimental to oxidation and corrosion resistance; therefore, a compromise in the balance of properties was required.

It has been recognized for some time that articles could be cast in various shapes as a single crystal, thus eliminating grain boundaries. Known single crystal technology was applied to eliminate the problems associated with grain boundaries in the transverse direction of columnar structured alloys by developing such single crystal articles (without grain boundaries). This elimination of grain boundaries provides greater freedom in alloying and an increase in alloy melting points. Such increases in the melting point of an alloy permits higher heat treatment temperatures, thus resulting in more effective strengthening of the alloy.

Early application of single crystals to turbine parts was performed using conventional nickel-base superalloys or modifications thereto. In order to achieve a satisfactory combination of properties and castability, use of such alloys as cast single crystal articles resulted in some sacrifice in the surface-related properties of oxidation and hot corrosion resistance. Conversely, other studies with that type of alloy have shown that significant improvements in oxidation and hot corrosion resistance were achievable only through reductions in strength and/or castability. Thus, there has been a need for an alloy specifically designed for casting as a single crystal and which produced an article having an improved combination of mechanical properties and improved resistance to oxidation and hot corrosion.

BRIEF SUMMARY OF THE INVENTION

It is a principal object of this invention to provide a nickel-base superalloy having a combination of improved mechanical properties and resistance to oxidation and hot corrosion.

Another object is to provide such a nickel-base superalloy capable of being cast as a single crystal article.

A further object is to provide such a cast article, including such an alloy, which is capable of increased performance through increased operating temperature or increased life, and having an improved combination of mechanical properties and resistance to oxidation and hot corrosion.

An additional object is to provide a method of producing such a cast single crystal article from such an alloy.

These and other objects and advantages will be more clearly understood from the following detailed description, drawing, and specific examples which are intended to be typical of, rather than in any way limiting on, the scope of the present invention.

Briefly, the present invention provides an improved nickel-base superalloy designed for casting as a single crystal by applying the techniques of directional solidification to produce an improved article suitable for use in high stress, high temperature turbomachinery, for example, such articles as gas turbine engine blades and vanes. The alloy consists essentially of 7–12% chromium (Cr), 1–5% molybdenum (Mo), 3–5% titanium (Ti), 3–5% aluminum (Al), 5–15% cobalt (Co), 3–12% tungsten (W), 2–6% tantalum (Ta), up to 10% rhenium (Re), up to 2% columbium (Cb), up to 3% vanadium (V), up to 2% Hf, the balance essentially nickel (Ni) and incidental impurities. As used herein, all percentages are weight percentages unless otherwise noted.

The composition of the present invention provides a balance between the alloying elements necessary to provide an alloy designed for casting as a single crystal article having a unique combination of improved mechanical properties and improved resistance to oxidation and hot corrosion.

The present invention also provides a method for the production of such a single crystal article including a heat treatment for the development of properties and a unique structure.

BRIEF DESCRIPTION OF THE DRAWING

For a better understanding of the invention, reference may be had to the following description, taken in conjunction with the accompanying drawing, wherein.

DESCRIPTION OF THE PREFERRED EMBODIMENTS

Figure 1:
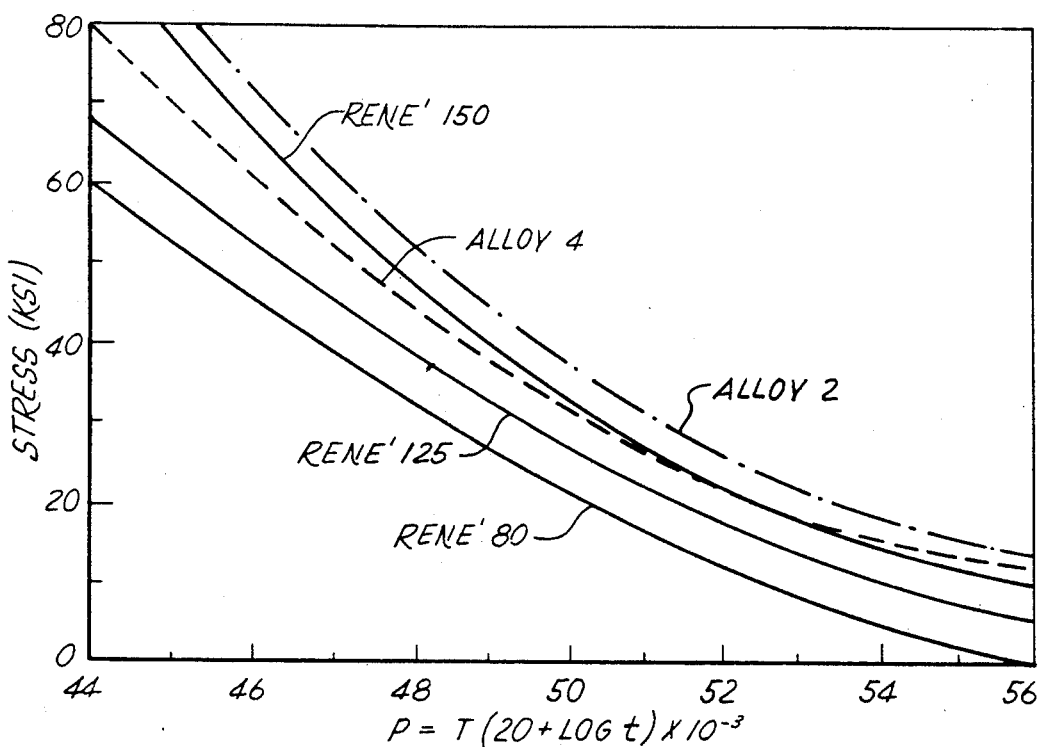
FIG. 1 is a graphical comparison of stress rupture data of the present invention with other current or production alloys shown for the normal grain form generally selected for use.

The present invention defines a unique combination of alloying elements which result in a nickel-base superalloy specifically designed and particularly adapted to casting as a single crystal article, such alloy and article having a combination of improved mechanical properties and improved resistance to oxidation and hot corrosion. An overall improvement in a combination of critical properties has not been recognized prior to this invention.

The basic metallurgy of nickel-base superalloys can be presented by use of the Ni-Al binary phase diagram, although in reality the alloys are considerably more complex in their chemical composition. The basic strengthening mechanisms of nickel-base superalloys previously known in the art are solid solution strengthening and precipitation hardening.

A primary tool utilized in design of such nickel-base superalloys is known as partition analysis which is based on a knowledge of how alloying elements are partitioned or divided between the phases in an alloy. For the purpose of this discussion, it will be understood that a phase of an alloy is a homogeneous, physically and chemically distinct constituent, that is separated from the remainder of the alloy by distinct bonding surfaces. The structure of the alloys, typical of Ni-base superalloys, consists of a major phase known as gamma, which is the matrix of the alloy and is commonly referred to as the gamma matrix, a major precipitate phase within the gamma matrix, referred to as the gamma prime precipitate, and minor amounts of carbides and borides. The high temperature strength of a nickel-base superalloy is related to the amount of gamma prime precipitate phase present, in addition to the solid solution strengthening of the gamma matrix. The alloying elements partition between the phases with the most important being the partitioning between the gamma matrix and the gamma prime precipitate. An understanding of how the elements partition between the phases is necessary in alloy design to permit calculation of several alloy characteristics of importance: the chemical composition of gamma, gamma prime, carbides and borides; the amount of gamma prime present as gamma prime particles and as gamma-gamma prime eutectic; stability of the gamma phase; atomic lattice mismatch between gamma and gamma prime; and alloy density.

An analysis of a number of superalloys has shown that among those alloying elements generally used in the development of nickel-base superalloys, elements partitioning to the gamma matrix and which act as gamma solid solution strengthening elements are: Cr, Co, Mo, W, Re, and Al. Solid solution strengthening is generally attributed to atom-size differences and to electron effects. In general, the heavy (large atom) refractory elements such as Re, W, and Mo, are the most effective strengtheners at high temperatures. Solid solution strengthening must be achieved without causing instability of the matrix structure. Instability, which will have adverse effects on the alloy properties, results from the development of unwanted phases or precipitates at high temperatures. Such phases or precipitates are to be specifically avoided.

The second major strengthening mechanism recognized in nickel-base superalloys is precipitation hardening. The precipitate is formed within the gamma matrix and is known as gamma prime. Gamma prime is basically an ordered face-centered cubic compound, $Ni_3Al$, which is coherent with the nickel matrix. The $Ni_3Al$ can be alloyed with many elements: Cr, Co, Mo, W, Ta, Cb, and V.

An understanding of this metallurgy is necessary to provide an improved nickel-base superalloy designed for casting as a single crystal article having an improved combination of mechanical properties and resistance to oxidation and hot corrosion. Such an article can be used for successful operation under strenuous operating conditions as are found in advanced gas turbine engines. Such a design includes a proper balance of alloying elements which provide for principal and secondary strengthening mechanisms and resistance to oxidation and corrosion. Thus, the alloy is specifically adapted for being cast as a single crystal article while retaining its basic properties.

The combination of alloying elements previously discussed provides the capability of producing, such as through heat treatment, a duplex structure of a combination of coarse and fine gamma prime particles. The alloy of the present invention has advantages superior to known alloys. An increase in incipient melting temperature is realized. In addition, the careful balance of strengthening elements which strengthen the gamma prime precipitate phase provides for a higher gamma prime solution temperature. Furthermore, the alloy is adaptable specifically to single crystal development by application of directional solidification techniques. Thus, an article having such a duplex structure and made from the composition provided by the present invention has a higher temperature operating capability, is capable of operating in a high stress environment, has overtemperature protection such that chances of experiencing incipient melting is reduced, and can experience longer life as a result of increased oxidation and hot corrosion resistance.

The present invention will be more fully understood from the following discussion of representative examples of alloy forms studied during the evaluation of the present invention. Such examples are not intended to be limitations on the scope of this invention.

As stated before, the alloy and article of the present invention consists essentially of 7-12% Cr, 1-5% Mo, 3-5% Ti, 3-5% Al, 5-15% Co, 3-12% W, 2-6% Ta, up to 10% Re, up to 2% Cb, up to 3% V, up to 2% Hf, balance essentially Ni and incidental impurities. However, one preferred form of such alloy consists essentially of 7-9% Cr, 1-3% Mo, 3-5% Ti, 3-5% Al, 5-10% Co, 4-8% W, 2-6% Ta, 2-6% Re, up to 1% Cb, up to 1% V, up to 0.5% Hf, balance essentially Ni with incidental impurities. Another preferred form does not include Re and consists essentially of 8-12% Cr, 1-3% Mo, 3-5% Ti, 3-5% Al, 5-10% Co, 5-7% W, 2-6% Ta, up to 1% Cb, up to 1% V, up to 0.5% Hf, balance essentially Ni with incidental impurities.

The principal interest of the alloy of the present invention is its use in a single grain article. Therefore, the standard grain boundary modifiers, C, B, Zr, which are detrimental to such single grain articles, are not added and are included, if at all, at impurity levels. These elements act as melting point depressants and their presence at greater than impurity levels will result in limitations on alloying and in heat treatment to obtain maximum strengths.

Cr above about 12% and below about 7% results in the presence of undesirable oxides at aluminum levels of 3-5%. The presence of such Cr oxides will result in reduced oxidation resistance. An increase in Al will then effectively reduce hot corrosion resistance. Therefore, a careful balance must be maintained between Cr and Al to provide good oxidation and hot corrosion resistance. The range for Cr is 7-12% and Al is 3-5%. Data generated in the evaluation of the present invention shows that a high Cr:Al ratio of about 1.5-4 will provide an alloy with superior oxidation and hot corrosion resistance while also providing a high strength material if other elemental additions are properly balanced. To maintain the balance between Cr and Al required to achieve good oxidation and hot corrosion resistance, the present invention recognizes that the Cr:Al ratio be maintained in such range of about 1.5 to about 4.

Aluminum is added primarily for strength through $Ni_3Al$ (gamma prime) formation. Al is important for oxidation resistance but must maintain the $Ni_3Al$ structure. Cb, Ta, and Ti can be substituted for Al for purposes of gamma prime strengthening since too much Al, for example, substantially greater than about 5%, will result in instability of the gamma prime. Less than about 2% Al will not allow the formation of sufficient gamma prime to develop adequate strength. For the alloy of the present invention, the Al range is 3-5%.

Titanium is normally present as a gamma prime strengthener. Its presence also is important in oxidation reactions, although it is not as desirable as other elemental additions, such as Al. The presence of Ti, however, reduces the requirement for Al to produce gamma prime thus freeing Cr to act primarily to improve corrosion resistance, i.e., increases the Cr:Al ratio. Therefore, for improved corrosion resistance, the present invention provides an alloy with a Cr:Al ratio greater than known alloys of the type previously used for single crystal structures.

The presence of Ti in amounts exceeding about 5% will result in a loss of oxidation and corrosion resistance and the formation of $Ni_3Ti$, an unwanted phase. In amounts less than about 3%, the Ti will not be present in an amount sufficient to maximize corrosion resistance. To achieve an effective Cr:Al ratio, Ti is present in an amount within the range of about 3% to 5% and sufficient to form an Al:Ti ratio in the range of about 0.5 to about 1.

Tungsten is an effective gamma and gamma prime strengthener partitioning equally between the two phases. The presence of W generally increases the melting point of nickel and is a viable alloying element for high temperature strength. The maximum level of W in the alloy of the present invention has been determined to be about 12% for single grain articles. Instabilities have been observed above this level. The presence of W in general can be detrimental to both high temperature oxidation and hot corrosion resistance. However, below about 3%, W has little effect on the properties of the alloy. It is preferred to limit the amount of W present to intermediate levels of about 4-8%.

Rhenium can be included in forms of the present invention for improved high temperature strength. The Re partitions almost entirely to the gamma matrix. However, in the presence of W, a small amount of Re will partition to the gamma prime phase, thus reducing the total effectiveness of Re. It should be noted that W partitions about 40-50% to the gamma prime phase. It is thus felt that Re is a more effective strengthener than W based on the difference in the partitioning behavior of the two elements. When the gamma prime phase precipitates from solid solution, Re must diffuse away from the gamma prime particle, thus slowing the gamma prime growth rate. This retarding effect would be expected to refine the gamma prime size and retard gamma prime agglomeration during service. Re will also slow the rate of solutioning of gamma prime during heat treatment. The presence of Re above about 10% will result in alloy instability in the temperature range of 1800°-2000° F. Rhenium, if present, is therefore limited to about 10%.

Columbium behaves much the same as Ti and Ta, being present in the Ni$_3$Al (gamma prime) phase. The solubility of Cb in Ni$_3$Al is less than either Ti or Ta. The presence of Cb, although beneficial to overall properties in small amounts, depresses the alloy melting point above levels of about 2% more rapidly than Ta and is therefore limited to lower amounts when used in the alloy of the present invention.

Tantalum acts like Ti in nickel-base superalloys, partitioning almost entirely to the gamma prime phase. Ta is preferred over Ti because of its high melting point and the fact that it does not depress the alloy melting point as much as does Ti. Ta also aids in promoting corrosion resistance by inhibiting surface Al$_2$O$_3$ formation. Ta is a heavy element having a much higher density than Ti. Thus, by emphasizing Ti rather than Ta, a lighter article can be achieved while still providing greater hot corrosion resistance due to the presence of Ti. However, some Ta, in amounts of 2-6%, is beneficial for participation in the corrosion resistance and strengthening mechanisms.

Cobalt is beneficial in nickel-base superalloys in at least two ways. Co tends to raise the solid solubility temperature of gamma prime, thereby increasing temperature capability of the alloys. About 5% Co tends to improve structural stability by inhibiting sigma precipitation, while larger amounts, greater than about 15%, will contribute to sigma instability. In Ni-base superalloys, Co contributes to improved castability. Cobalt preferably at the 5-10% level has been found to be a valuable addition to turbine blade alloys and is a constituent of the alloy of this invention.

Vanadium has been used as a gamma prime former and tends to promote gamma prime formation without gamma plus gamma prime eutectic. It is essentially a substitute for Ti, but because it also acts as a melting point depressant, its presence can cause eutectic formation. V can be detrimental to oxidation and corrosion resistance and is preferred to be substantially excluded from the alloy composition except where maximum strengthening is desirable. In the alloy of the present invention, less Vanadium is required because of the presence and balance of other strengthening elements. Up to 3% can be tolerated in the present invention.

Mo acts like W, but has a lower density and is generally less effective as a strengthener than is W. Also, Mo tends to be detrimental to corrosion resistance at low Cr levels, such as less than about 7% Cr. Relatively higher Mo contents, up to about 5%, can be tolerated in the presence of higher Cr contents. However, in the alloy of the present invention, which has higher Cr contents, a small amount of Mo will result in an added strength benefit. Beyond about 3% Mo, increased strength benefit is not realized and the detrimental effects due to corrosion resistance becomes noticeable at greater than about 5% Mo. In the preferred forms of the alloy of the present invention, the Cr level is about 7-12% and the Mo level is about 1-3%.

Generally, Hf is used in superalloys as a grain boundary strengthener in the range of 0.5-2.5%. In single crystal alloys, in the absence of grain boundaries, Hf is not required as a grain boundary strengthener. Hf does, however, provide increased resistance to oxidation; thus, as will be discussed, the alloy of the present invention provides for the presence of small amounts of Hf, up to about 2%. In a preferred form of the present invention Hf is included in amounts up to about 0.5%. At such level the beneficial results of improved resistance to oxidation are realized while further effects on reduced incipient melting are avoided.

In order to produce an article from the alloy of this invention, it is important that a proper heat treatment be applied to allow for complete utilization of the balance of elements present to develop fully the unique combination of mechanical properties and resistance to oxidation and corrosion. If, during heat treatment, incipient melting occurs at a temperature where the gamma prime is incompletely solutioned, the maximum strength of the alloy cannot be realized. If incipient melting occurs, the gamma prime which remains as gamma plus gamma prime eutectic nodules or as large, undissolved particles, is not as effective in strengthening as are the smaller gamma prime particles which precipitate from solution during cooling from the solution temperature. The temperature differential between the gamma prime solution temperature and the temperature where incipient melting begins should be large enough to allow for variability inherent in production heat treatment furnaces, generally plus or minus 25° F.

The alloy and article of this invention is designed to eliminate the need for grain boundary strengtheners, thus providing greater freedom in alloying and an increase in alloy melting points. An increase in the incipient melting point permits higher heat treatment temperatures and more effective solutioning of the gamma prime phase. Solution of the gamma plus gamma prime eutectic nodules and precipitation as small gamma prime particles during cooling results in an increase in the "effective" gamma prime content of an alloy. The effective gamma prime content in most equiaxed and columnar alloys is about 50%. By eliminating the grain boundary strengtheners and increasing the incipient melting point, the effective gamma prime content has been increased to about 60% in the alloys of the present invention.

The cast article of the present invention is heat treated sufficiently to substantially fully develop a duplex gamma prime structure, one providing a combination of fine and coarse gamma prime precipitate for adequate strength development. One form of the heat treatment method successfully utilized with the alloy of the present invention to substantially fully develop a duplex gamma prime structure includes heating the article between about 2200° F. and 2300° F. for about 2-4 hours, but at least 25° F. below the incipient melting temperature to place the gamma prime phase into solid solution. The article was then cooled at a rate of 100° F. to 150° F. per minute to below about 1975° F. and then at a rate of 75° F. to 150° F. per minute to about 1200° F. The article was then reheated to about 1975° F. for about four hours and then cooled at a rate of 75° F. to 150° F. per minute to about 1200° F. and then heating at about 1650° F. for 12-16 hours followed by cooling to ambient temperature.

Table I lists the composition of selected forms of such alloys which were made and tested in connection with the present invention, along with alloys 3, 5 and 12 through 15, the composition of which lie outside the scope of the present invention. Alloys 3, 5 and 12 through 15 are shown for comparative purposes and will be more fully discussed later.

TABLE I

| Alloy Form | Alloy Compositions (Wt %) | | | | | | | | | | | |
|---|---|---|---|---|---|---|---|---|---|---|---|---|
| | Ni | Cr | Co | Al | Ta | Ti | W | Mo | Re | Cb | C | Hf | B |
| 1 | Bal | 7.5 | 7.5 | 3.35 | 3.72 | 4.30 | 7.6 | 1.44 | 0 | .52 | | | |
| 2 | Bal | 7.5 | 7.4 | 3.3 | 3.52 | 4.30 | 5.2 | 1.43 | 2.98 | .5 | | | |
| 3 | Bal | 8.15 | 7.4 | 3.5 | 3.75 | 4.4 | 7.5 | 1.48 | 0 | .49 | .06 | 1.12 | .009 |
| 4 | Bal | 8.95 | 7.6 | 3.5 | 3.72 | 4.45 | 6.0 | 1.46 | 0 | .51 | | | |
| 5 | Bal | 8.95 | 7.3 | 3.4 | 3.81 | 4.5 | 6.4 | 1.46 | 0 | .51 | .05 | 1.2 | .002 |
| 6 | Bal | 10.1 | 7.4 | 3.4 | 3.4 | 3.95 | 7.7 | 1.46 | 0 | .53 | | | |
| 7 | Bal | 10.0 | 7.3 | 3.4 | 3.38 | 3.35 | 9.5 | 1.44 | 0 | .5 | | | |
| 8 | Bal | 11.4 | 7.4 | 3.6 | 3.37 | 4.4 | 6.85 | 1.46 | 0 | .52 | | | |
| 9 | Bal | 10.9 | 7.3 | 3.4 | 3.38 | 3.35 | 7.6 | 1.45 | 0 | .51 | | | |
| 10 | Bal | 11.6 | 7.0 | 3.7 | 3.28 | 4.5 | 5.8 | 1.45 | 0 | .56 | | | |
| 11 | Bal | 11.9 | 7.1 | 3.4 | 3.42 | 3.35 | 7.6 | 1.45 | 0 | .51 | | | |
| 12 | Bal | 13.7 | 7.2 | 2.95 | 2.94 | 4.85 | 4.2 | 1.49 | 0 | .54 | | | |
| 13 | Bal | 13.5 | 7.1 | 2.7 | 2.97 | 3.95 | 5.85 | 1.47 | 0 | .52 | | | |
| 14 | Bal | 14.0 | 6.85 | 2.75 | 2.97 | 3.05 | 7.5 | 1.45 | 0 | .51 | | | |
| 15 | Bal | 14.0 | 7.0 | 3.95 | 3.09 | 2.0 | 7.7 | 1.46 | 0 | .51 | | | |

Table II lists the chemical composition and commonly used grain form of current production or development nickel-base superalloys. The alloys shown in Table II are included for comparison with the present invention. The Table II alloys have been selected for comparative purposes because René 80 exhibits the best hot corrosion resistance, René 125 exhibits the best oxidation resistance, and René 150 exhibits the best strength.

TABLE II

| Superalloy | Composition (Wt %) | | | | | | | | | | Grain Form |
|---|---|---|---|---|---|---|---|---|---|---|---|
| | Cr | Co | Al | Ti | Ta | W | Mo | Hf | V | Re | |
| René' 80 | 14 | 9.5 | 3 | 5 | — | 4 | 4 | — | — | — | Equiaxed |
| René' 125 | 8.9 | 10 | 4.8 | 2.5 | 3.5 | 7 | 2.5 | 1.5 | — | — | Equiaxed |
| René' 150 | 5 | 12 | 5.5 | — | 6 | 5 | 1 | 1.5 | 2.2 | 3 | Columnar |

Stress rupture properties for some of the alloys of Tables I and II are shown in Table III wherein the term KSI means thousands of pounds per square inch. The stress rupture strengths for some of these alloys are graphically presented in FIG. 1 where stress is plotted as a function of the well-known and widely used metallurgical stress rupture relationship known as the Larson-Miller Parameter, $P = T(C \; \mathrm{logt}) \times 10^{-3}$ where $C = 20$, described in more detail in American Society for Metals Transactions, 1952, Vol. 745, at pages 765-771. Use of such a parameter allows a wide variety of comparisons between stress rupture lives at various temperatures and at selected stress levels.

Generally, strengths of the alloy of the present invention in the transverse direction are equal to strengths in the longitudinal direction. Alloy 2, one preferred form of the alloy of this invention, exhibited improved stress rupture life when processed according to the method of this invention. The stress rupture capability of Alloy 2 is shown in FIG. 1 and compared with the stress rupture capabilities of current production or development nickel-base superalloys developed in the commonly used grain form of those alloys as detailed in Table II and specifically exhibits a marked improvement in stress rupture capability as compared with René 150, the strongest alloy of the current production or development alloys.

TABLE III

| Alloy Form | Orientation* | Stress Rupture Properties | | |
|---|---|---|---|---|
| | | Stress Rupture Life (Hrs) | | |
| | | 1650° F./ 60 ksi | 1800° F./ 35 ksi | 2000° F./ 15 ksi |
| 1 | L | 210.3 | 149.0 | 194.1 |
| 1 | T | — | — | 200.9 |
| 2 | L | 289.7 | 210.7 | 311.8 |
| 2 | T | — | — | 351.6 |
| 3 | L | 136.0 | 113.4 | 163.3 |
| 4 | L | 102.6 | 107.2 | 171.6 |
| 4 | T | — | — | 106.3 |
| 5 | L | 56.3 | 55.6 | 78.4 |
| 6 | L | 129.0 | 157.8 | 241.0 |
| 9 | L | 108.8 | 110.1 | 98.1 |
| 13 | L | 35.4 | 35.1 | 18.9 |
| 15 | L | 47.6 | 38.3 | 11.9 |
| René' 80 | L | 5 | 25 | 5 |
| René' 125 | L | 20 | 80 | 30 |
| René' 150 | L | 180 | 100 | 100 |

*L = longitudinal
T = transverse

As determined from FIG. 1, an operating stress of 20 KSI, selecting a 1000 hour life, will result in an operating temperature approximately 50° F. higher for Alloy 2 as compared to René 150. Similarly, for a given temperature and a given desired life, Alloy 2 can be operated at a higher stress than René 150. At the higher test temperature of 2000° F. and load of 15 KSI, Alloy 2 has three times the life of René 150, but the improvement is not as noticeable at the lower test temperature of 1600° F. and load of 60 KSI.

Also shown in FIG. 1 is the stress rupture capability of Alloy 4, another preferred form of this invention, which has a composition similar to Alloy 2, but is characterized by the substantial absence of Re. Alloy 4 is capable of producing improved rupture strengths at higher operating temperatures as compared with René 150. Alloy 4 will realize its greatest utility at operating temperatures above 1900° F. Substitution of Re for W, comparing Alloys 1 and 2, resulted in a 35-60% increase in rupture life. A 60% increase in rupture life at 2000° F. means that Alloy 2 is capable of operating at a temperature of 20° F. greater than Alloy 1 for an equivalent operating stress and desired life.

Alloy 4 has significantly greater strength than Alloy 5, as shown in Table III, although both alloys have similar compositions, as shown in Table I, except that Alloy 4 is characterized by the substantial absence of C, Hf, and B. The presence of C, Hf, and B in certain alloy forms such as Alloy 5 causes incipient melting at a reduced temperature, below that required for full solutioning. Therefore, Alloy 5 cannot be fully solutioned to develop increased strength. Alloy 4, however, exhibits greater strengths as a result of being fully solutioned at a higher temperature. Although Hf can be included in small amounts in forms of the present invention, the extent of its inclusion must be balanced with other alloying elements to enable appropriate heat treatment.

Alloy 3 has a composition similar to Alloy 5 and also specifically includes the presence of C, Hf, and B. Because of such presence of C and B, and the resultant effect of such elements on the incipient melting and solutioning temperatures, Alloys 3 and 5 are outside the scope of the present invention. Alloy 3 also must be solutioned at a lower temperature to avoid incipient melting, similar to Alloy 5. Alloy 3 exhibits greater strength as shown in Table III as a result of a higher W content as seen in Table I. As previously discussed, W is a solid solution strengthener and its strengthening effect is not dependent upon the degree of gamma prime solutioning. However, the oxidation resistance of Alloy 3 is deficient, as will be shown in Table IV.

Alloy 3 has a composition similar to Alloy 1, except that Alloy 1 specifically excludes the presence of C, Hf, and B. Alloy 1 can be fully solutioned at a higher temperature, thereby taking advantage of full gamma prime strengthening. Thus, for essentially identical compositions, the degree of solutioning is shown to have a large effect on the degree of strength developed within an alloy.

Alloys 6 and 9 are capable of full gamma prime solutioning. Alloy 6 is capable of obtaining greater strength levels than Alloys 9 and 4 and is stronger than Alloy 1 at elevated temperatures. Although high strengths are obtainable for alloys of the composition of Alloy 6 or 9, evidence of microstructural instability was observed in these alloys as a result of the high degree of alloying present. Such instability is to be avoided for those applications in which long time life is desired. Additionally, as will be discussed, other properties such as oxidation and hot corrosion resistance of alloys 6 and 9 are lower than those of Alloy 4. Thus, various lives or strength levels can be developed, sometimes at the sacrifice of other properties or long time life.

Figure 2:
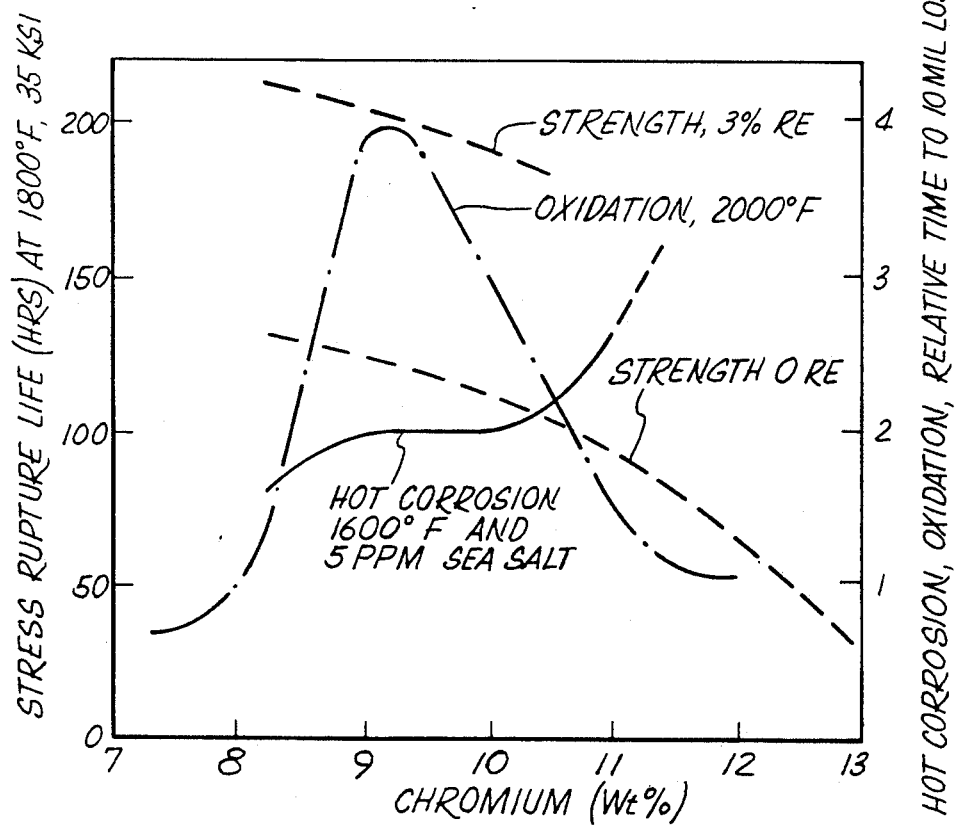
FIG. 2 is a graphical comparison of strength and environmental resistance properties as a function of weight percentage chromium present in the alloy of the present invention.

Alloys 13 and 15, which contain higher levels of Cr (13–14%) and are outside of the scope of the present invention, exhibit very poor stress rupture lives. FIG. 2 shows that as the effective amount of Cr is reduced, either in the presence of 3% Re or 0% Re, the stress rupture life is increased.

Dynamic oxidation and hot corrosion tests were conducted on selected forms of alloys which were made and tested in connection with this invention along with Alloys 3, 5, 13 and 15, the composition of which lie outside the scope of the present invention. The conditions and results of oxidation resistance testing are presented in Table IV. Very little oxidation was observed after 500 hours at 1800° F. Results at 2000° F. indicated improvements over René 80 alloy but lack of improvement over René 125 alloy, the best oxidation resistant alloy among current production and development alloys.

The best alloys in the 2000° F. dynamic oxidation tests were alloy forms 4, 5 and 15. Behavior of Alloy 15 could be expected due to low Ti and high Al contents. However, when other properties, such as strength are considered, Alloy 15 does not show an overall improvement in a combination of properties.

Data from Alloy 4 indicates that about 9% Cr is specifically preferred for improved oxidation resistance in the alloy of the present invention. FIG. 2 clearly shows that a peak in oxidation resistance is observed at a Cr level of about 9%. In dynamic oxidation testing at 2075° F., Alloy 4 experienced a low surface weight loss although the presence of some internal oxidation was observed.

Alloy 5 contains about 9% Cr and has an overall composition that is very similar to Alloy 4. As shown in Table I, the major difference between Alloys 4 and 5 is the presence of C, Hf and B in Alloy 5. As previously discussed, the presence of Hf provides increased resistance to oxidation. The amount of Hf present in Alloy 5 provides such an improvement in oxidation resistance as compared to Alloy 4. When other properties, such as strength are considered, Alloy 5 does not show an overall improvement in a combination of properties. Such low properties excludes Alloys 5 and 15 from consideration for high temperature application.

TABLE IV

| Alloy Form | Oxidation Resistance Dynamic Oxidation-Average Weight Change ($mg/cm^2$) | | |
|---|---|---|---|
| | 1800° F./ 500 hrs | 2000° F./ 450 hrs | 2075° F./ 88 hrs |
| 1 | −0.7 | −164 | 34 |
| 2 | −2.0 | −160 | 14 |
| 3 | −1.0 | −161 | — |
| 4 | −0.9 | −64.1 | 5 |
| 5 | +0.2 | −45.2 | — |
| 6 | −2.8 | −122.4 | 21 |
| 9 | −4.1 | −119.2 | 28 |
| 13 | −4.0 | −185.5 | — |
| 15 | −0.8 | −63.8 | — |
| Rene' 80 | −3.3 | −227.9 | 45 |
| Rene' 125 | −0.4 | −29.0 | — |
| Rene' 150 | −2.0 | — | — |

Alloy 2, however, is particularly suited to high temperature service since it does not exhibit susceptibility to internal oxidation. Such oxidation has a deleterious effect on the life of an article subjected to high temperature service, resulting in an overall reduction of total mechanical properties. Minor surface oxidation will not have as great a reducing effect on total mechanical properties. Alloy 2, it will be noted, has reduced levels of W present which can be detrimental to high temperature dynamic oxidation resistance.

The conditions and results of hot corrosion testing are presented in Table V. All alloy forms shown exhibit improvements over René 125 alloy at 1600° F. Only Alloys 13 and 15, which are outside the scope of the present invention, as discussed above, and which contain 13–14% Cr, appear to exhibit improvement over René 80 alloy, the best corrosion resistant alloy among current production or development alloys. Such behaviour is expected due to the large amounts of Cr present in Alloys 13 and 15; however, a consideration of other important properties, such as strength, exclude these alloys from further consideration. At the higher test temperature of 1700° F., Alloy 2 exhibits the best corrosion resistance. Alloy 4 is intermediate and those alloys having compositions showing the least resistance to corrosive attack at 1700° F. within the scope of the present invention (Alloys 6 and 9) contain higher amounts of Cr (10–11%) than Alloys 2 or 4 (7.5–9.0%). FIG. 2 shows that resistance to hot corrosion will be greater above about 11% Cr, but will be constant in the 8–11% range. The alloys of the present invention are capable of developing greater hot corrosion resistance than previously known single crystal alloys.

TABLE V

| Alloy Form | Hot Corrosion Resistance | | | |
|---|---|---|---|---|
| | 1600° F./5 ppm Salt Max Penetration (mils/side) | | | 1700° F./5 ppm Salt Max Penetration (mils/side) |
| | 153 hrs | 191 hrs | 335.3 hrs | 217 hrs |
| 1 | Total[a] | — | — | 6.0 |
| 2 | 2.5 | — | Total[b] | 3.0 |
| 3 | 14.5 | — | 19.3 | — |
| 4 | 17.7 | — | 16.0 | 7.0 |
| 5 | 7.5 | — | 13.5 | — |
| 6 | 11.2 | Total[b] | — | 16.0 |
| 9 | 5.0 | 14.5 | — | 17.5 |
| 13 | 1.5 | — | 4.0 | — |
| 15 | — | — | 5.0 | — |
| Rene' 80 | 3.3 | — | 6.8 | — |
| Rene' 125 | 35 mils at 87 hours | | | |
| Rene' 150 | Total at 87 hours | | | |

[a]Total penetration at tip. Average penetration for two specimens = 7.5 mils/side
[b]Total penetration > 60 mils/side A summary graph, relating strength, oxidation and hot corrosion resistance to the Cr content of the alloys of this invention as previously discussed is shown in FIG. 2. At a Cr level of about 9% a peak in oxidation resistance is observed. Also presented in FIG. 2 are summary plots of strength levels obtainable for alloys containing 0% and 3% Re in the presence of variable amounts of Cr. Additionally, adequate hot corrosion resistance can be obtained with Cr levels of about 9%. In summary, a unique combination of mechanical properties and resistance to oxidation and hot corrosion can be obtained in nickel-base superalloys, according to the present invention, through an unexpected selection and combination of alloying elements and duplex structure development, described above, through heat treatment than were previously recognized in alloys prior to this invention.

Although the present invention has been described in connection with specific examples and embodiments, it will be understood by those skilled in the art the variations and modifications of which the invention is capable within its broad scope.

We claim:

1. An improved nickel-base superalloy capable of being cast as a single crystal by directional solidification, having an improved balance of high temperature strength and high temperature oxidation and corrosion resistance consisting essentially of, by weight: 7–12% Cr, 1–5% Mo, 3–5% Ti, 3–5% Al, 5–15% Co, 3–12% W, 2–6% Ta, up to 10% Re, up to 2% Cb, up to 3% V, up to 2% Hf, balance Ni and incidental impurities, further characterized wherein the superalloy has no added C, B, and Zr and, if present, said elements, are at impurity levels, the alloy having an Al:Ti ratio from about 0.5 to about 1 while maintaining the Cr:Al ratio from about 1.5–4.

2. The alloy of claim 1 in which, by weight: Cr is 7–10%, Mo is 1–3%, Ti is 3–5%, Al is 3–4%, Co is 5–10%, W is 4–8%, Ta is 2–6%, Re is 2–6%, Cb is up to 1%, V is up to 1%, Hf is up to 0.5%.

3. The alloy of claim 2 wherein the Al:Ti ratio is from about 0.7–1.0 while the Cr:Al ratio is in the range of about 2.5–3.

4. The alloy of claim 3 wherein Cr is 7–9%.

5. The alloy of claim 1 further characterized by the absence of Re as an intentionally added alloying element and wherein Cr is 8–10%, Mo is 1–3%, Ti is 3–5%, Al is 3–4%, Co is 5–10%, W is 5–7%, Ta is 2–6%, Cb is up to 1%, V is up to 1%, and Hf is up to 0.5%.

6. A cast article of the superalloy of claim 1 having a heat treated single crystal structure and an improved balance of high temperature strength and resistance to oxidation and hot corrosion, being suited for use as an element in a gas turbine engine, and further characterized by the presence of a substantially fully developed duplex gamma prime structure of a combination of coarse and fine gamma prime precipitate.

7. The cast article of claim 6 of the superalloy of claim 4 or 5.

8. The superalloy of claim 5 wherein the Al:Ti ratio is in the range of about 0.7–1.0 while the Cr:Al ratio is in the range of about 2.5–3.

9. The article of claim 6 wherein the effective gamma prime content is at least about 60 percent.

10. The superalloy of claim 1 further characterized by the absence of V, Re, and Hf as intentionally added alloying elements and wherein Cr is about 9.0 to 9.5%, Mo is about 1.3 to 1.7%, Ti is about 4.1 to 4.3%, Al is about 3.6 to 3.8%, Co is about 7 to 8%, Ta is about 3.8 to 4.2%, and Cb is about 0.4 to 0.6%.

11. The cast article of claim 6 of the alloy of claim 10.

12. The method of making a cast and heat treated single crystal article of a nickel-base superalloy comprising the steps of:
   (a) providing a superalloy of the composition of claim 1;
   (b) melting and directionally solidifying the superalloy to produce a single crystal article; and
   (c) heat treating the article to substantially fully develop a duplex gamma prime structure comprising a combination of fine and coarse gamma prime precipitates within the heat treated article.

13. The method of claim 12 in which the superalloy is of the composition of claims 4 or 5.

14. The method of claim 12 wherein said heat treating comprises the steps of:
   (a) heating the article between about 2200° F. to about 2300° F., but at least about 25° F. below the incipient melting temperature of the superalloy, for about 2 to about 4 hours;
   (b) cooling the article at a rate of about 100° F. to about 150° F. per minute to below about 1975° F., then at a rate of about 75° F. to about 150° F. per minute to about 1200° F.;
   (c) reheating the article to about 1950° F. to about 2000° F. for about 4 hours;
   (d) cooling the article at a rate of about 75° F. to about 150° F. per minute to about 1200° F.;
   (e) heating the article at about 1650° F. for about 12 to about 16 hours; and
   (f) cooling the article to ambient temperature.

15. The method of claim 12 wherein the effective gamma prime content is at least about 60 percent.

16. The method of claim 12 in which the alloy is of the composition of claim 11.

* * * * *